United States Patent [19]
Lindell

[11] Patent Number: 5,113,416
[45] Date of Patent: May 12, 1992

[54] DIGITAL RADIO FREQUENCY COMPENSATION

[75] Inventor: Karl B. Lindell, Lidingo, Sweden

[73] Assignee: Ericsson GE Mobile Communications Holding, Inc., Paramus, N.J.

[21] Appl. No.: 604,141

[22] Filed: Oct. 26, 1990

[51] Int. Cl.⁵ .............................................. H03B 5/32
[52] U.S. Cl. ...................................... 375/97; 331/69; 331/158; 455/69; 455/119; 375/106
[58] Field of Search .......................... 331/66, 69, 158; 455/33, 51, 54, 71, 119; 370/94.1, 95.3, 103; 375/97, 106, 108

[56] References Cited
U.S. PATENT DOCUMENTS

| | | | |
|---|---|---|---|
| 3,550,006 | 12/1970 | Harner | 455/119 |
| 3,662,269 | 5/1972 | Osborne et al. | 455/71 |
| 4,290,145 | 9/1981 | Saba et al. | 455/119 |
| 4,509,200 | 4/1985 | Luginbuhl et al. | 455/51 |

*Primary Examiner*—Benedict V. Safourek
*Attorney, Agent, or Firm*—Johnson & Gibbs

[57] ABSTRACT

A system for adjusting the frequency of transmissions between a base station and a mobile station. The mobile station detects the frequency of the signal received from the base station, determines whether the signal was received from the current base station and adjusts the output signal of a local crystal-controlled reference oscillator in accordance with the difference between the frequency of the output signal and the frequency of the received signal.

22 Claims, 6 Drawing Sheets

DIGITAL RADIO FREQUENCY COMPENSATION

BACKGROUND OF THE INVENTION

1. Field of the Invention

The invention relates to radio frequency stabilization and, more particularly, frequency drift compensation in a digital radio system.

2. History of the Prior Art

A fundamental concept underlying radio communications systems is that transmission and reception must occur at specific operating frequencies and that such frequencies must be stable over a period of time. Most systems achieve frequency stability by including a crystal oscillator which generates a very precise frequency which is then used to produce the various high frequency signals employed in the different components of the radio. Crystals are, however, subject to slight variations in their resonant frequency of oscillation due to various environmental conditions and other factors. At resonant frequencies in the megahertz range, even small percentage variations result in sufficiently large changes in operating frequency to affect the operation of the radio. For example, a high quality standard reference crystal oscillator may have a frequency stability on the order of ±10 PPM. Thus, the different factors which cause variations in the frequency of oscillation of a reference crystal must be taken into account in radio design.

The three principle factors which cause variations in the frequency of oscillation of a crystal are temperature, aging, and the voltage applied to the crystal itself. To provide frequency stabilization in larger radio systems, such as those used in the base stations of cellular radio systems, the reference crystal is frequently mounted within an oven which is held at a selected temperature to a high degree of accuracy to reduce variations in the crystal's output frequency due to temperature changes. An oven reference crystal oscillator can maintain a frequency stability of ±0.1 PPM. Other more compact radio circuits, such as cellular mobile stations, cannot include temperature stabilizing ovens because of size and power consumption and must rely on various techniques to compensate for frequency variations in the crystal due to temperature.

Certain radio systems, both transmitters and receivers, include a relatively wide information channel and therefore slight variations in the tuning frequencies in the radios can be tolerated and still work properly. However, in radios having relatively narrow channels, the oscillator frequencies must be very precise in order to insure that the radio transmitter and receiver remain tuned to the desired channel rather than an adjacent channel at a slightly different frequency.

In digital radio systems forming part of a radio network, each of the radio channels are frequently very narrow, e.g., 12.5 KH$_z$, and this requires good frequency stability in the mobile stations of the system. Further, such systems operate at very high data speeds, e.g., on the order of 8K bits/second. In order to achieve such high data rates, a modulation technique such as low pass filtered FSK (modified GMSK) is used which requires a high level of frequency stability in the carrier frequency of the transmitter. For example, frequency stability on the order of ±1.5 PPM (±1.35 KH$_z$ at 900 MH$_z$ carrier) is often specified to obtain the desired accuracy in data transmission. A digital radio system similar to the type in which the present invention is used is disclosed in U.S. patent application Ser. No. 07/560,784, filed Jul. 31, 1990, entitled "A Method of Adopting a Mobile Radio Communications System To Traffic and Performance Requirements" and which is assigned to the assignee of the present invention and hereby incorporated by reference herein.

One approach to the periodic measurement and adjustment of the operating frequency within the mobile station of a cellular communication system is to receive the carrier signal from the base station and use that signal as a standard against which the local oscillator within the mobile station is compared and adjusted. Since the base station generally includes a frequency standard having an oven temperature stabilized crystal oscillator, its frequency is relatively stable and suitable for use as a standard in frequency stability compensation. For example, in U.S. Pat. No. 4,921,467 to Lax, a signal transmitted to a receiver is used to tune and adjust the frequency of the local oscillator within the receiver. In the Lax patent, frequency stability is obtained in a radio receiver by compensating for variations in temperature and other factors which may affect the frequency of the crystal. In this technique, a radio is initially calibrated during manufacture to include a stored table of voltage compensation values as a function of temperature for the voltage controlled local oscillator so that at a given temperature, a correct value of compensation voltage may be applied to obtain the proper frequency of oscillation. In addition, a signal is received from a transmitter and processed with the output of the voltage controlled local oscillator so as to generate an error signal if there is any difference between their respective frequencies. A correction voltage is produced, stored and used to correct the output of the local oscillator for variations in the frequency of the crystal from that of the transmitter.

In radio receiver frequency stabilization systems such as that taught by the Lax patent, crystal frequency compensation due to aging is relatively straight forward because of the availability of a continuous signal from a transmitter which can be used as a comparison standard along with feedback to properly correct the local oscillator frequency. However, in digital packet radio systems, numerous additional problems are present which do not allow the straightforward use of such systems.

In digital packet radio communications, there are often a plurality of different systems working simultaneously on the same frequency channels within a radio network. That is, a mobile station must be careful to insure that the signal that it is receiving and using as a frequency standard come from its own base station and not from some other base station broadcasting on the same channel. In addition, radio frequency interference and other spurious output signals may produce RF signals on the same frequency and a mobile must not mistake any of these signals for that of its base station when seeking to measure the stability of its reference oscillator frequency.

Another aspect of digital packet radio systems which makes it difficult to use a signal transmitted from a base station to measure and frequency stabilize the reference oscillator of the mobile station is that data signals are broadcast in burst mode. That is, the transmissions are all very short bursts of RF energy followed by the absence of RF signals in the spacing between bursts. This means that a mobile must be capable of making frequency measurements of the signal transmitted by the base station very quickly. It must also measure the true mean frequency of the transmitted signal even though the carrier signal is usually modulated with digital data.

The system of the present invention overcomes these and other disadvantages of the prior art and enables the mobile station of a digital packet radio system to periodically measure the frequency of the signal being transmitted from its base station and use that signal to adjust the output of its own crystal-controlled reference oscillator. This ensures that both the transmitting circuitry and receiving circuitry of the mobile station is properly frequency stabilized for each of the potential variable parameters which could cause the reference frequency oscillator to be operating at less than a very high degree of frequency stability.

SUMMARY OF THE INVENTION

In one aspect, the system of the present invention includes calibrating the crystal of a mobile station of a digital packet radio system by receiving the transmitted signal from a base station, verifying that the received signal came from the proper base station, storing the received value, and then using the received signal to verify that the oscillator within the base station is on the proper frequency and, if not, to correct that frequency.

One aspect of the invention includes a method and system for generating a frequency compensation voltage for a crystal controlled reference oscillator within a mobile station of a packet data radio system. A sequence of voltage values is stored in a first location each of which voltages corresponds to the temperature compensation voltage to be applied to the reference oscillator at a particular temperature to produce a reference frequency signal at a particular frequency. The current temperature of the reference oscillator is measured and the temperature compensation voltage corresponding to the measured temperature is selected from the first storage location and applied to the reference oscillator. A burst of transmitted data is received from a base station and the frequency of the signal received from the base station is compared with the frequency of the signal output from the reference oscillator to produce a difference signal. A crystal aging compensation value indicative of the difference between the frequency of the reference oscillator output signal and the frequency of the signal received from the base station is stored in a second location. It is determined whether or not the burst of transmitted data received by the mobile was transmitted by the current base station of the mobile station and, if so, the selected temperature compensation voltage is modified in accordance with the aging compensation value in the second storage location and applied to the reference oscillator to produce the same frequency as that received from the base station.

In another aspect, the invention includes a method and system for generating a frequency compensation voltage for a crystal controlled reference oscillator within a mobile station of a packet data radio system in which the frequency comparison comprises counting a preselected number of cycles of a signal derived from the signal received from the base station and generating a periodic gating signal. The number of cycles of a signal derived from the reference oscillator signal which occur between successive gating signals is counted and compared with a value related to the frequency received from the base station to determine the difference indicative value.

In a still further aspect the invention includes a method and system for generating a frequency compensation voltage for a crystal controlled reference oscillator within a mobile station of a packet data radio system in which a sequence of values representative of the variation of frequency of the crystal oscillator as a function of tuning voltage applied to the oscillator is stored in a third location. The tuning voltage applied to the crystal oscillator is measured and a value is selected from the third storage location which corresponds to the measured tuning voltage applied to the crystal oscillator. The crystal temperature and crystal aging compensation voltages from the first and second storage locations are further modified in accordance with the value selected from the third storage location means and applied to the reference oscillator to obtain the frequency received from the base station.

BRIEF DESCRIPTIONS OF THE DRAWINGS

For an understanding of the present invention and for further objects and advantages thereof, reference may now be had to the following description taken in conjunction with the accompanying drawing, in which.

DETAILED DESCRIPTION

Various embodiments of the system of the present invention will be described as implemented in a particular digital packet cellular mobile communications systems of a type which the relevant literature designates a "slotted ALOHA" system. Although the radio with which the present invention is exemplified is intended to handle only data communications, such systems are capable of handling both packet data as well as speech communication and comprises some features which are not essential to the system of the present invention. Accordingly, the invention is not restricted to this particular system but may be implemented in various different systems.

Figure 1:
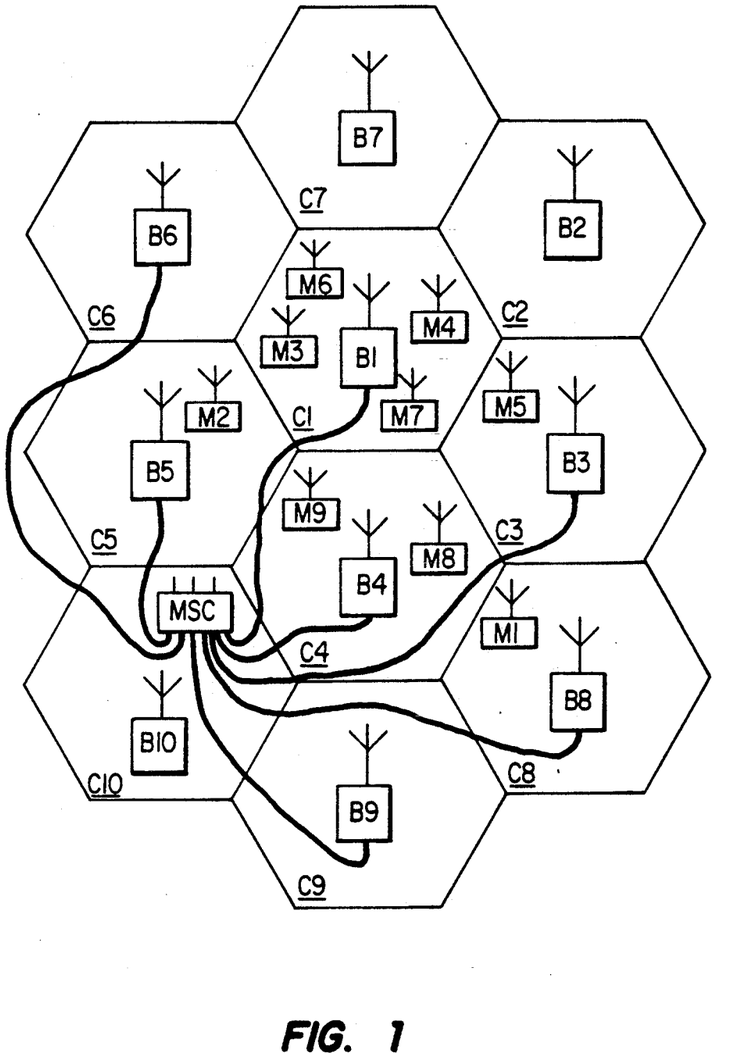
FIG. 1 is an illustrative diagram of a cellular mobile radio system in which the system of the present invention may be utilized.

Referring first to FIG. 1, there is illustrated a digital cellular radio system including mobile station radios which implement the frequency stabilization system of the present invention. FIG. 1 illustrates ten cells C1-C10, each of which includes a base station B1-B10, respectively. FIG. 1 also illustrates ten mobile stations M1-M10 which are moveable within a cell and from one cell to another cell within the system. Also illustrated in FIG. 1 is a mobile switching center (MSC) which is connected to all ten of the illustrated base stations (B1-B10) by means of electrical connections such as the cable shown. The mobile switching center may also be connected to a fixed public switching telephone network or similar fixed private network (not shown).

The mobile system illustrated in FIG. 1 comprises at least one duplex radio channel and preferably a plurality of duplex radio channels for communication between the various base stations and the mobiles. Although some advantages may be achieved when two or more base stations share a radio channel, according to prevailing traffic load, it will first be assumed, for the purpose of making the system of the invention easier to understand, that each base station has its own duplex radio channel (pair of simplex radio channels) or its own allotted time on a duplex radio channel (pair of simplex radio channels) for communication with mobile stations served by that base station.

Although two or more base stations may cooperate in certain procedures, e.g., handoff or roaming, it will, for the purpose of explaining the present invention, be sufficient to consider only the communication between one base station, e.g., B1, and one of the mobile stations served by that particular base station, e.g., M3, M4, M6 and M7.

Figure 2:
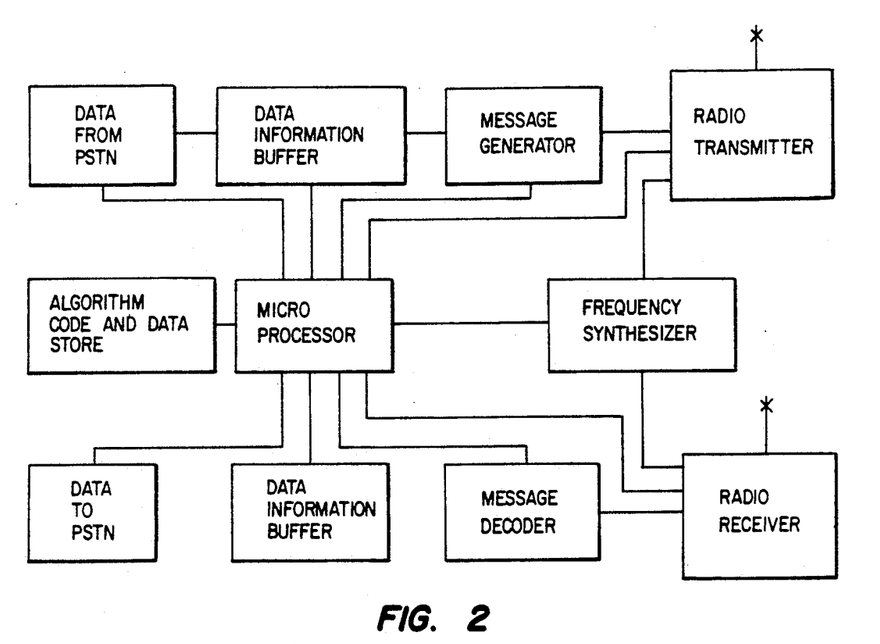
FIG. 2 is a block diagram of a base station within a digital packet cellular radio system.
Figure 8:
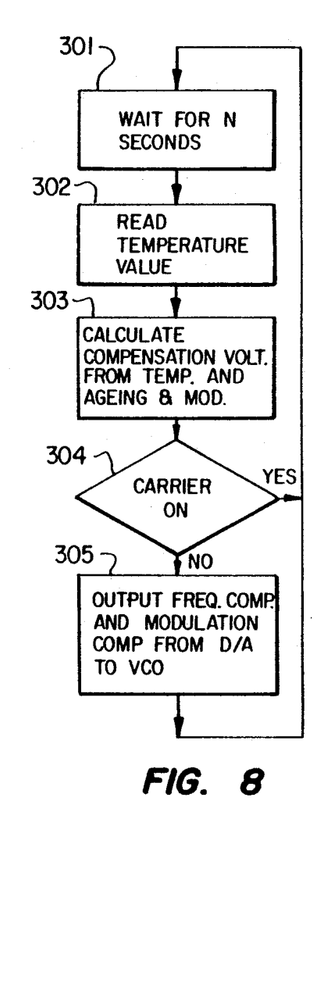
FIG. 8 is a flow chart illustrating certain aspects of the frequency compensation system of the present invention.

FIG. 2 illustrates a block diagram of a mobile station within the system of FIG. 1 and FIG. 8 illustrates a block diagram of a base station within FIG. 1, each for possible use in connection with the system of the present invention. The base and mobile stations are designed for full duplex digital message communications in time slots of a radio channel that may be shared by plural mobile stations within plural mobile systems of a network. Although a base station normally comprises means for enabling it to simultaneously communicate on more than one radio channel only means for communication on one radio channel is illustrated in FIG. 8.

Figure 3:
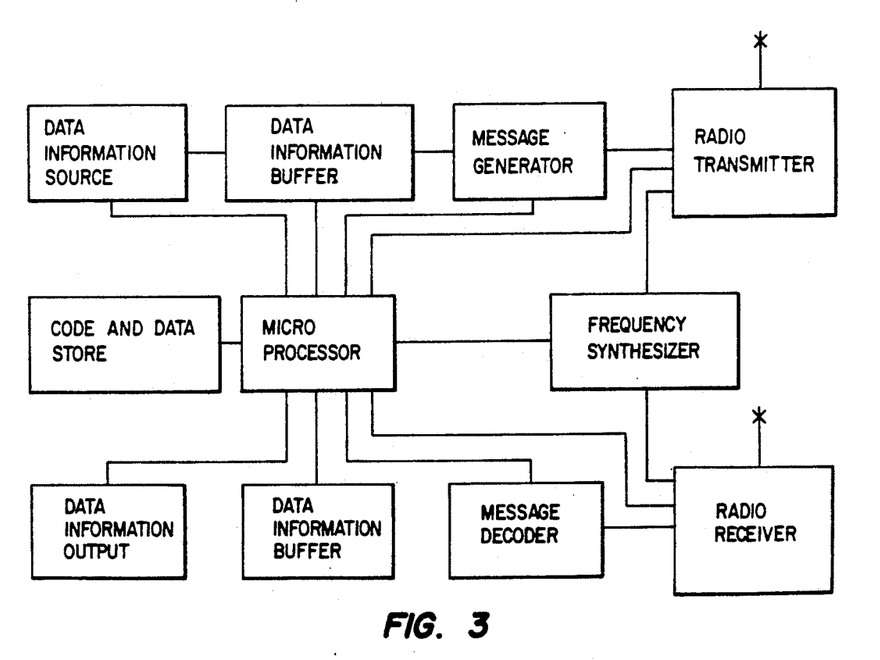
FIG. 3 is a block diagram of a mobile station within a digital packet cellular radio system.

Both base and mobile stations comprise a microprocessor control radio receiver. Referring to both FIGS. 2 and 3, the radio transmitter 10 transmits radio signals modulated with digital messages generated by a message generator 11. In the mobile station of FIG. 3, the message generator is connected to a data information source 12, e.g., a keyboard, via a data information buffer 13. The information to be transmitted in both the mobile and the base stations is processed by means of a data modulator 24 and a data signal processor 25. In the base station of FIG. 2, the message generator and data information buffer 12 is connected to a data line terminal 14 receiving data from a data network to which the data terminal is connected by circuits such as fixed telephone lines. In the mobile station, the message decoder 18 is connected to a data information output means 15, e.g., the display, via data information buffer 16. In the base station, the message decoder 18 is instead connected via data information buffer 16 to a data line terminal 17 supplying data to a data network to which the data terminal is connected by circuits such as fixed telephone lines. Transmitted information received by the receiver of both the base and the mobile stations is processed by an audio output processor 26 and a data demodulator 27. The radio channel on which the radio transmitters and receivers of both the mobile and base stations operate is determined by frequencies supplied from a frequency synthesizer 20 controlled by the microprocessor 21. Finally, the base and mobile both include means 22 for storing algorithms, codes, rules, formats, data and compensation values.

Figure 4A:
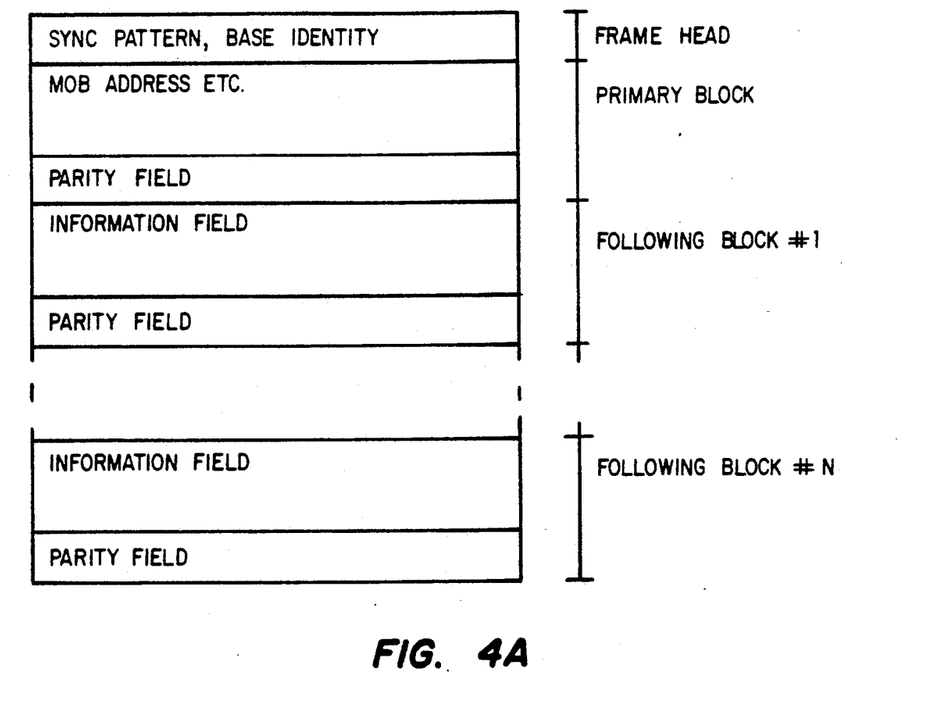
FIG. 4A is a diagram illustrating the overall signaling protocol used in the digital packet radio in which the system of the present invention is used.
Figure 4B:
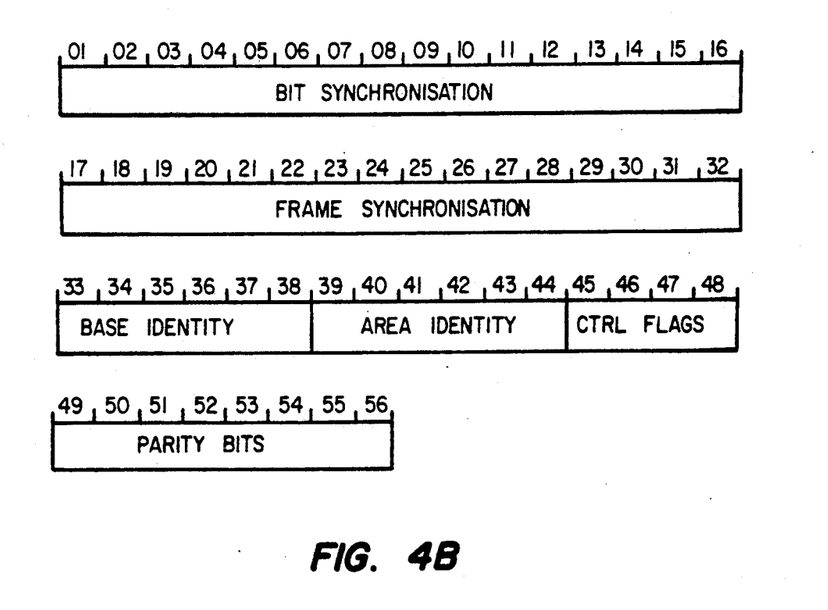
FIG. 4B is a diagram illustrating the signaling protocol within the framehead of a signal transmitted by the base station of a digital packet radio system in which the system of the present invention is used.

The digital packet radio system of the present invention maintains its communications in accordance with a prescribed signalling protocol which includes a logical structure of data controlling the communication between each base station and the mobile stations. In particular, and as is illustrated in the diagram of FIG. 4A, each burst of transmitted information from the base station to a mobile includes a framehead 31 which is followed by other control information and data, a primary block 32 and additional data blocks 33, each of which includes a parity field 34 for error detection and correction. The protocol format of each framehead for each transmitted packet is the same. FIG. 4B illustrates the arrangement of the data comprising the framehead showing that bits 1-16 comprise the bit synchronization block 34, bits 17-32 comprise the frame synchronization block 35, while bits 33-38, 39-44, and 45-48 comprise the base identity 36, area identity 37, and control flag blocks 38 and bits 49-56 comprise parity bits 39 used in the error correction system of the radio. The bit synchronization block 34 always includes the same pattern of ones and zeros which enables an accurate measurement of the transmitted frequency as will be further discussed below. In addition, the base identity and area identity blocks 36 and 37 together identify the particular base station so that upon receipt, the mobile can ensure that the signal received is from the particular current base station of the mobile prior to measuring the received signal as will be described below. The remainder of the frame of digital information transmitted over the radio channel following the framehead is the primary block 32 which includes the mobile station address and other information and a parity field 34. Thereafter, information fields 33, a sequence of blocks of information comprising an information field and a parity field 34, are broadcast until the required information has been transmitted.

As discussed above, the mobile stations within the system of the present invention operate within an environment in which radio channels are shared within a network between more than one operator and, thus, it is essential that a mobile which is to use a signal transmitted from a base station as its frequency stability standard use only its own base station for such purpose. In addition, the transmitters of the present system operate in burst mode and, as a result, a mobile station only has a very short time period in which to take measurements of the signal transmitted from a base station.

Because the shared channels in the present radio system are relatively narrow, i.e., only on the order of 12.5 $KH_z$ in width, and operate with a relatively high data rate, on the order of 8K bits/second, the system requires a high degree of frequency stability within both its transmitter and its receiver. The mobile stations within the system operate within a frequency stability standard of about $\pm 1.5$ PPM ($\pm 1.35$ $KH_z$ at 900 $MH_z$). For this reason, there must be a high level of stability within the reference oscillators of the radio circuits. In most cases, such a high level frequency stability is only obtainable through use of oven control crystal oscillators. However, mobile stations cannot, for reasons of both size and cost, obtain frequency stability in this way. The method and circuit of the present invention enables a very high degree of reference crystal frequency stability within a mobile unit without temperature control of the reference oscillator.

The system of the present invention involves three basic components which contribute to frequency stability of the crystal within the reference frequency oscillator: (a) temperature component; (b) aging component; and (c) modulation voltage component. The temperature component of crystal frequency stability relates to the fact that the resonant frequency of a crystal changes as a function of the temperature of the crystal. Initially, the crystal reference oscillator of a mobile station within the system of the present invention is calibrated during manufacture by receiving a reference carrier signal and cycling the radio through the entire range of temperature conditions under which it is intended to operate. At each incremental value of temperature, there is determined the specific value of compensation voltage which is necessary to cause the crystal to operate at the desired frequency at that specific temperature. In this way, a series of voltages are stored in a look-up table, one voltage for each value of temperature, within a memory of the radio to be recalled as a temperature compensation value to be used when the radio is operating at that particular temperature.

The aging component of the crystal frequency stability relates to the fact that as a crystal ages over time, its resonant frequency changes. The system of the present invention compensates for crystal aging by measuring the output frequency of the crystal with the temperature compensation voltage applied and then comparing that output signal to the received standard frequency from the base station. If the frequency of the crystal within the mobile has varied from its desired value, an aging compensation voltage is introduced which causes the crystal to return to the same frequency as that of the base station transmitter which is used as the standard. The aging component of crystal frequency voltage compensation simply shifts the temperature compensation curve in one direction or another but does not change the shape of that curve.

The modulation voltage component of crystal frequency stability relates to the fact that the resonant frequency of the crystal varies as a function of the tuning voltage which is applied to the crystal oscillator. As that modulation voltage changes, it changes the shape of variations in the crystal's output frequency as a function of temperature.

The temperature compensation values are stored as voltage values in a memory within the radio based upon a calibration routine performed when the radio is manufactured. The aging compensation values of the crystal vary as a function of the voltage applied to the reference oscillator. Thus, the aging compensation value is stored as a value of frequency deviation but before it is applied to correct the crystal, it is converted to a voltage based upon the voltage-to-frequency relationship of that particular reference oscillator. In the present system, a test of change in frequency as a function of voltage for the particular radio circuit is run and that is stored in memory. These values are used in applying the aging compensation voltage at a particular temperature of operation.

Figure 5:
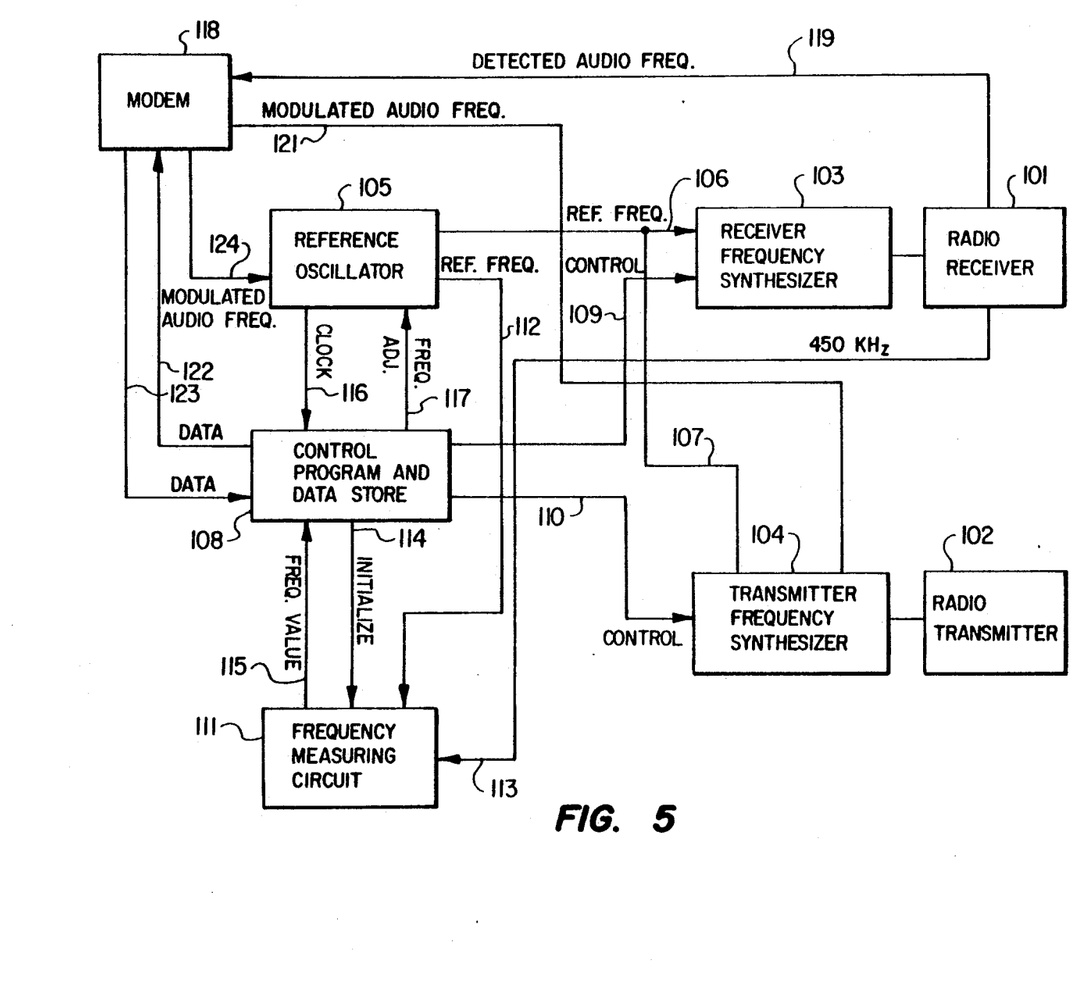
FIG. 5 is a block diagram of a frequency compensation system constructed in accordance with the present invention.

Referring now to FIG. 5, there is shown a block diagram of a mobile radio station frequency compensation system constructed in accordance with the teachings of the present invention. A radio receiver 101 and a radio transmitter 102 are each connected, respectively, to a receiver frequency synthesizer 103 and a transmitter frequency synthesizer 104, each of which operate in accordance with standard phase locked loop frequency synthesization circuitry. Both the receiver frequency synthesizer 103 and the transmitter frequency synthesizer 104 receive a reference frequency from a reference oscillator 105 which includes a reference crystal, the resonant frequency of which is stabilized in accordance with the system of the present invention. The reference frequency is connected to the receiver frequency synthesizer 103 via line 106 and to the transmitter frequency synthesizer 104 via line 107. The receiver frequency synthesizer 103 and transmitter frequency synthesizer 104 are operated under control of a control, program and data store module 108, which includes a micro-processor and a memory, and is connected to the two synthesizers 103 and 104 by means of control lines 109 and 110, respectively. A frequency measuring circuit 111 receives a reference frequency from the reference oscillator 105 via line 112 and a standard reference signal is received from the transmitter of the base station (not shown) by the radio receiver 101 and which is connected to the frequency measuring circuit 111 via line 113. In the present system, the base station transmitter signal is used in the form of a second IF frequency of 450 $KH_z$. The control, program and data store module 108 is connected to the frequency measuring circuit 111 to provide an initialization signal on line 114 and to receive a measured frequency value on line 115. The module 108 is also connected to the reference oscillator 105 to receive a clock signal, derived from the reference frequency signal, on line 116. The module 108 also provides a frequency adjustment signal on line 117 to change the value of the reference frequency being generated by the reference oscillator in accordance with the results of the frequency measuring circuit 111 and its comparison of the reference frequency to the standard signal received from the base station transmitter.

A modem 118 receives a detected audio frequency from the radio receiver 101 via line 119 and provides a modulated audio frequency signal to the transmitter frequency synthesizer 104 via line 121. The modem 118 receives data from the control, program and data store module 108 via line 122 and sends data to the module 108 via line 123. The modem also provides a moduled audio frequency signal to the reference oscillator 105 on line 124 and to the transmitter frequency synthesizer 104 on line 121.

In general, the reference oscillator compensation circuitry of FIG. 5 functions as follows: The standard reference carrier signal broadcast from the base station, having a carrier frequency on the order of 900 $MH_z$, is received by the radio receiver 101 and reduced by series of mixers to an IF signal having a value of 450 $KH_z$. The 450 $KH_z$ signal is used to provide a one milli-second gating signal during which time the cycles of the reference frequency on line 112 from the reference oscillator 105 are counted in a counter. The number of cycles of this signal counted during the one milli-second time period is used as the value from which is determined the aging compensation value which should applied to crystal within the reference oscillator 105 to provide a stable frequency output.

The control, program and data store module 108 provides a frequency adjustment signal on line 117 based upon three parameters. First, a stored voltage representing a temperature compensation value for the crystal within the reference oscillator and which is based upon the temperature at which the oscillator is operating. Second, the module 108 supplies an aging component frequency compensation to the crystal within the reference oscillator 105 based upon the comparison between the reference frequency on line 112 and the period of the signal from the base station transmitter on line 113. This is done by using the base station signal on line 113 to provide a pair of gating pulses during which the number of cycles of the reference frequency on line 113 are counted. The control module 108 determines whether or not the reference frequency signal on line 112 is within the prescribed frequency range and, if not, adds a voltage component to correct for the aging of the crystal which has occurred and effectively shift the temperature compensation value in order to compensate for the aging of the crystal. In addition, the control module 108 receives data from the modem 118 on line 123 indicative of the modulation voltage on line 124. This enables the frequency adjustment voltages on line 117 to be varied to account for the modulation voltage component and adjust for the aging of the crystal as a function of the modulation voltage which is applied to the reference oscillator 105.

Figure 6:
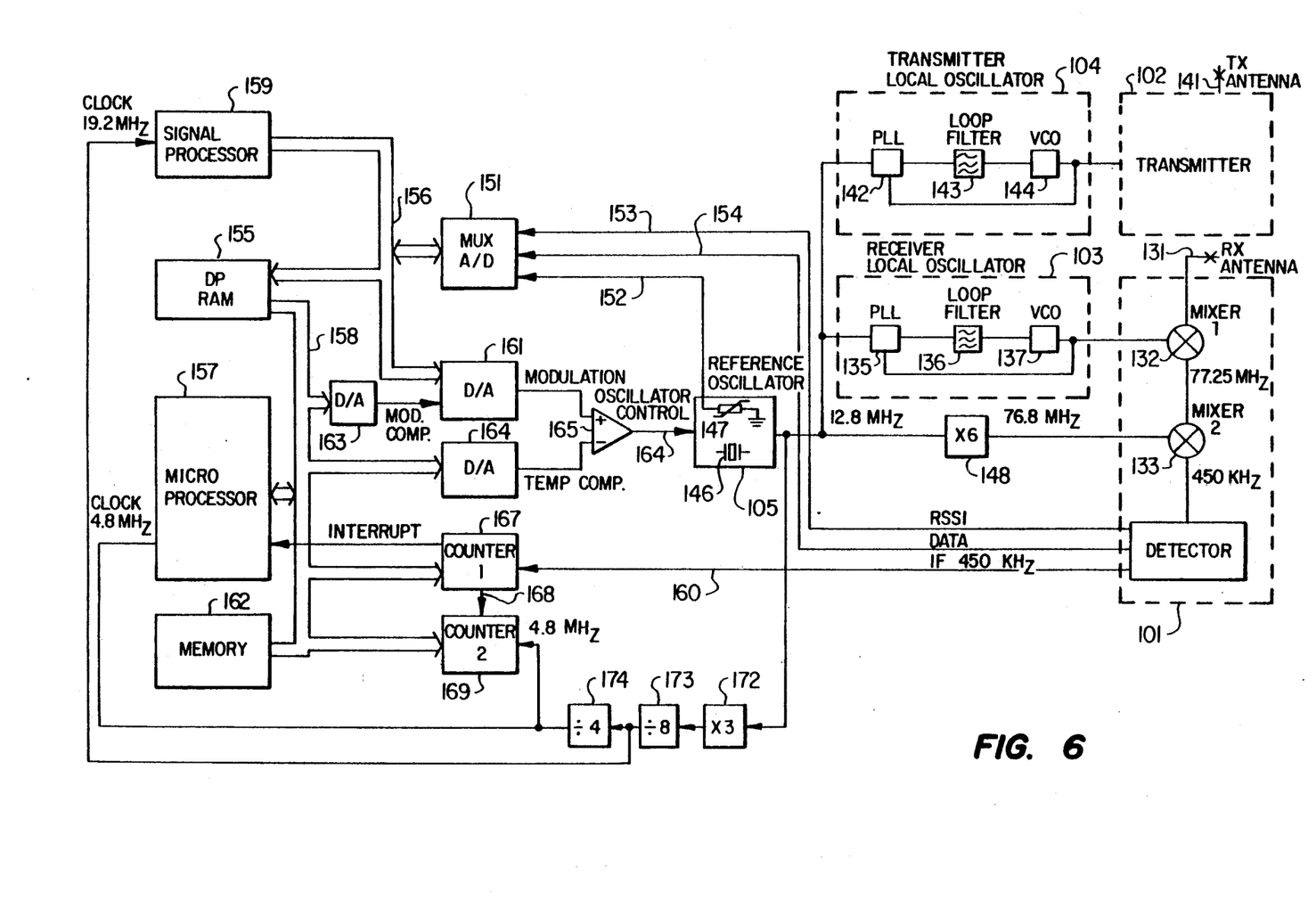
FIG. 6 is a schematic diagram of the frequency compensation system shown in FIG. 5.

Referring next to FIG. 6, there is shown a detailed block diagram of the frequency compensation system of the present invention. The receiver 101 includes a receiving antenna 131, a first mixer 132, a second mixer 133 and a detector 134. The receiver's frequency synthesizer 103 includes a conventional receiver local oscillator circuit comprising a phase locked-loop circuit 135, a loop filter 136 and a voltage controlled oscillator 137. Similarly, the transmitter 102 includes a transmitting antenna 141 and the transmitter frequency synthesizer 104 includes a relatively standard transmitter local oscillator circuit comprising a phase locked-loop circuit 142, a loop filter 143 and a voltage controlled oscillator 144. Both the receiver local oscillator 103 and the transmitter local oscillator 104 receive a reference frequency signal from the reference oscillator 105 which includes the reference crystal 146, the frequency stability of which is being compensated in the system of the present invention and a thermally sensitive measuring device 147, such as a thermistor, which produces an output signal on line 152 indicative of the temperature at which the reference oscillator 105 is operating. The 12.8 MH$_z$ reference frequency output signal of the reference oscillator is connected to the receiver frequency synthesizer 102, the transmitter frequency synthesizer 104 and the second mixer 133 of the receiver 101 through a times 6 frequency multiplier 148. The output signal from the thermally sensitive device 147 is coupled to a multiplexing analog-to-digital converter 151 via line 152 while the received signal strength signal (RSSI) is connected from the detector 134 in the receiver 101 to the multiplexing A/D converter on line 153 and data is connected from the detector 134 on line 154. The output of the multiplexing A/D converter 151 is connected to a dual-port RAM memory 155 through a bus structure 156 and from there to the control micro-processor 157 through its bus structure 158.

A signal processor 159, which serves primarily as a modem, is connected to both the double-port RAM 155 and a D/A converter 161 via the bus structure 156. A memory 162 is coupled to the micro-processor and other components via the bus structure 158. A modulation compensation digital-to-analog converter 163 receives an input from the bus structure 158 and is connected to provide a modulation compensation voltage to the D/A converter 161. A digital-to-analog converter 164 is connected to receive an input from the bus structure 158 and provide an output temperature compensation voltage to an operational amplifier 165. The output of the operational amplifier 165 provides an oscillator control signal on line 166 to apply the compensation voltage to the reference oscillator 145 and stabilize its output signal.

A first counter 167 receives a 450 KH$_z$ IF signal from the detector 134 within the receiver 101 and provides a gating signal over line 168 to a second counter 169. The counter 167 provides an interrupt signal on line 171 to the micro-processor 157. Both the first and second counters 167 and 169 receive inputs on the micro-processor bus structure 158. The reference frequency, 12.8 MH$_z$ from the reference oscillator 145, is connected through a times 3 multiplier circuit 172, a divide by 8 divider circuit 173 and a divide by 4 divider circuit 174 to produce a 4.8 MH$_z$ signal to one input of the second counter 169. The 4.8 MH$_z$ output signal from the divide by 4 divider 174 is connected to the micro-processor 157 as a 4.8 MH$_z$ clock signal while the output of the divide by 8 divider circuit 173 is connected to provide a 19.2 MH$_z$ clock signal to the signal processor 159.

Functionally, the signal processor 159 serves as a modem to generate modulation within the radio transmitter and to receive and detect transmitted data received from the detector 134 via the line 154 and the multiplexing analog converter 151. The DP RAM 155 is a double-port RAM memory which is used as temporary storage for communication between the signal processor 159 and the micro-processor 157. The microprocessor 157 controls the radio and runs the various algorithms which perform calculations and control functions within the radio. The memory 162 includes both ROM and RAM types of memory and stores the various data tables used in frequency compensation in accordance with the system of the present invention. The multiplexing A/D converter 151 receives the various analog signals and multiplexes them into the bus structure 156. The signals include the receive signal strength indicator (RSSI) signals from detector 134 and audio frequency data on line 154 from detector 134 along with the temperature signal from the thermistor 147 within the reference oscillator 105. The multiplexer 151 converts the audio signals to digital and then multiplexes the data from each of the three inputs into the data bus 156 for communication with the DP RAM 155 and the micro-processor 157.

The digital-to-analog converter 161 is part of the modulation voltage compensation system in the present system. A modulation voltage comes in from the signal processor 159 which produces a modulation compensation voltage to the input of the summing amplifier 165. The digital-to-analog converter 163 controls the gain through a reference voltage applied on line 170 to the digital-to-analog converter 161. The summation amplifier 165 receives signals from both of the digital-to-analog converters 161 and 164 and outputs an oscillator control signal on line 166 to the reference oscillator 105. The digital-to-analog converter 164 converts the digital values stored in memory 162 (from the look-up table stored during calibration) into an analog signal and applies that signal as a temperature compensation voltage to the summing amplifier 165. The value input to the digital-to-analog converter 164 has also been compensated for aging and gain related variations, just like the modulation voltage compensation discussed above. This value is output by the digital-to-analog converter 164 as a function of the aging compensation value measured in another part of the circuit.

The first counter of 167 gives a nominal one millisecond output pulse via line 168 to the second counter 169. Counter 169 counts the number of cycles of the 4.8 MHz signal which occur during the one milli-second gating pulses received from the first counter. This is then used as a measure of the frequency of the carrier signal received from the base station by the receiver 101. This frequency deviation value from the standard established by the base station transmitter is used to obtain the aging compensation to be applied to the crystal 146 within the oscillator 105. The dividers/multipliers 172, 173 and 174 process the reference frequency signal from the reference oscillator 105 to give a 4.8 MHz signal which goes both to the micro-processor 157 as a clock and to the second counter 169 as a representation of the reference frequency signal.

In the receiver 101, the signal received from the base station on antenna 131 is combined in the first mixer 132 with the signal from local oscillator 103 to produce a 75.25 MHz signal which is introduced to the second mixer 133 along with a 76.8 MHz signal, obtained from the reference oscillator by a times 6 multiplication circuit 148, to produce an output signal of 450 KHz to the detector 134. The 450 KHz IF signal on line 160 is connected to the input of the first counter 167 which counts 900 cycles and provides gating signals with a nominal one millisecond separation between them. The output of the reference oscillator 105, a 12.8 MHz reference frequency signal, is multiplied and divided in circuits 172, 173 and 174 to produce a 4.8 MHz signal as an input to the second counter 169. For every 900 cycles of the 450 KHz signal input into the first counter 167, it produces an output pulse on line 167 to the second counter 169. Thus, the signal output from the first counter 167 to the second counter 169 on line 168 is a square-wave pulse having a nominal one milli-second period. If the transmitting frequency of the base station is assumed to be the reference value and precisely correct, i.e., produces a one milli-second output signal on line 168, the second counter 169 will count 4,800 pulses from the 4.8 MHz signal during the one milli-second period. The value actually counted by the second counter 169 is sent to the micro-processor 157 and the memory 162 via the bus structure 158. The micro-processor 157 then determines the degree of deviation of the output signal of the reference oscillator 105 and adds an aging compensation voltage correction to the temperature compensation voltage stored in memory 162 and applies that value to the digital-to-analog converter 164. A value is received by the digital-to-analog converter 161, which represents the modulation voltage from the signal processor 159, along with a reference value voltage from the digital-to-analog converter 163, which represents a modulation compensation offset voltage, on line 170 to produce an analog output voltage to the summing amplifier 165. A composite oscillator control signal 166 is applied to the reference oscillator 103 to maintain the output reference frequency as near to the desire standard frequency value as possible.

Figure 7:
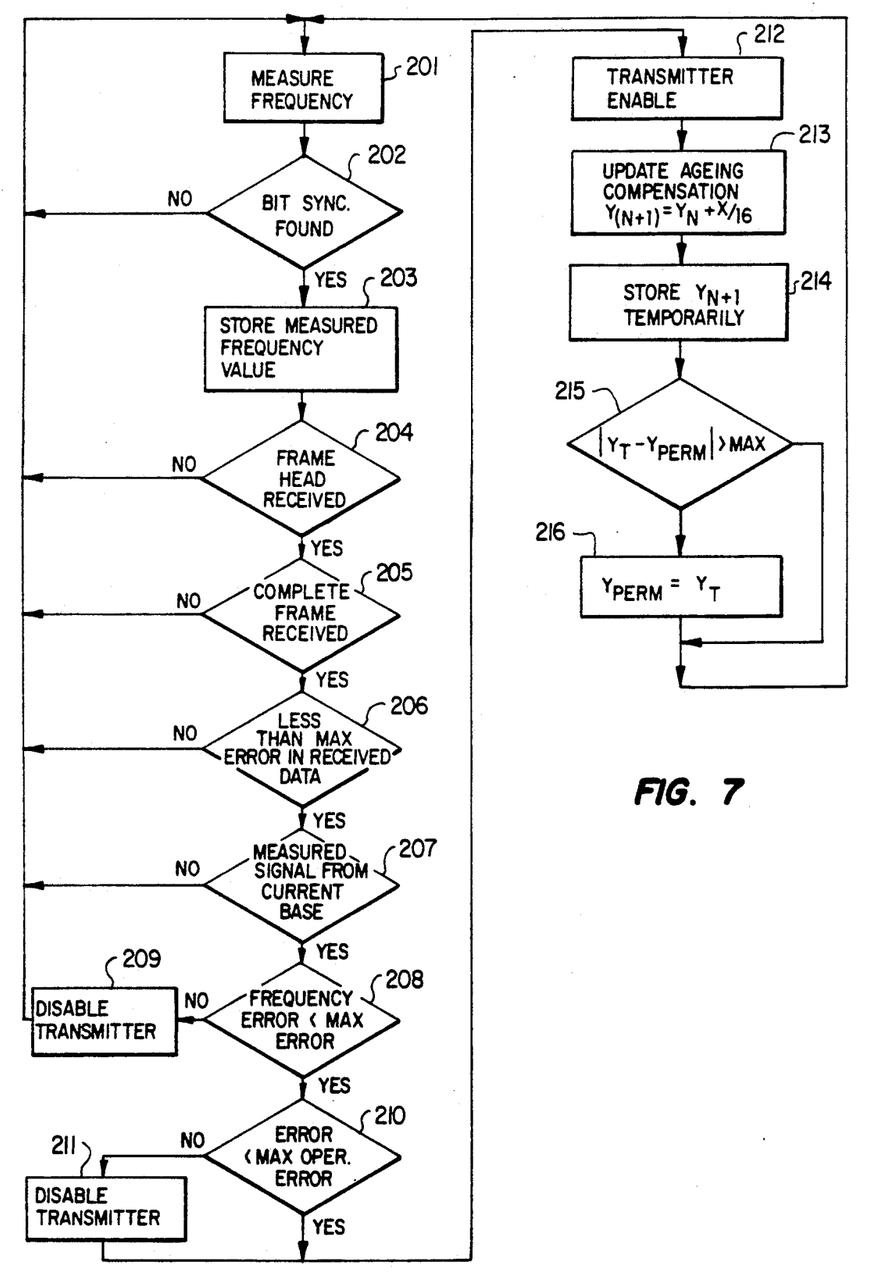
FIG. 7 is a flow chart illustrating the operation of the frequency compensation system of the present invention.

Referring now to FIG. 7, there is shown a flow chart indicating the program routine used by the system of the present invention to make the necessary measurements to provide frequency compensation within the system. At 201, the system measures a frequency value, as described above in connection with FIG. 6, during the approximate one milli-second burst of RF energy transmitted from the base station in the burst mode operation. The system makes the frequency measurement only during the time when it is receiving the bit synchronization block portion of the framehead to insure that the received frequency is used as a standard only during the consistent pattern of ones and zeros comprising each bit synchronization block. Since the pattern of data with which the transmitted signal is modulated effects the nominal frequency of the transmitted signal this consistent pattern of transmitted information insures greater accuracy within the measurements. Thus, at 202, the system determines whether or not the bit synchronization block was found within the signal which was measured. If not, the system recycles to 201 to measure again and if so, it moves to 203 to store the measured frequency value in memory. Next, at 204, the system determines whether the entire framehead of the transmitted burst has been received from the base station. The framehead portion of the transmitted data block contains the base identity block and the area identity block which together identify the particular base station transmitting the information. Once the system determines at 204 that a framehead has been received, it determines at 205 whether a complete frame has been received. The entire frame includes a parity field of data which enables the system to determine whether or not there are any data errors occurring in the transmission. This insures that any data corrections necessary will be made in the received information before decisions are made. That is, at 206 the system determines whether there is less than the maximum error in the received data so that the received data can be used to ascertain whether the correct base station has been received. If the data is determined to be of sufficient accuracy at 206, the system determines at 207 whether the signal measured at 201 was from the current base station of the mobile station doing the measuring.

If the system has determined after moving through steps 201–207 that a complete frame of sufficient accuracy to ascertain whether or not the measured frequency signal comes from the current base and, if so, the system moves to 208 where it determines whether or not the difference error between the frequency measured at 201 and the reference frequency within the reference oscillator, frequency error X, is less than a maximum allowable error value. At a nominal carrier frequency of 900 MHz the maximum error value might typically be on the order of 5 KHz. If the error was greater than the maximum allowable then the system automatically disables the transmitter of the mobile unit at 209 and prevents any additional transmission of signal from it. This prevents transmission of signals by a mobile station which would be out of its assigned frequency channel and cause serious problems within both the radio system and the network. If the frequency error X was within the allowable range, the system moves to 210 where it determines whether or not the error was less than the maximum operating error allowable without correction. If not, the transmitter is again disabled at 211 but if so, the transmitter continues to remain enabled at 212. At a nominal carrier frequency of 900 MHz the maximum operating error might typically be on the order of 1.5 KHz. In effect, steps 208 and 210 amount to a double check on the frequency error of the reference oscillator. Any exceedingly gross errors are limited in 208 and more subtle operating errors are accounted for in 210.

Next, at 213, the system updates the aging compensation value by setting $Y_{n+1}=Y_n+X/16$. The algorithm run at 213 is to avoid large incremental jumps in aging compensation value but rather include a slow and steady correction of the aging variations over a period of several sequential measurements. At 214, the system temporarily stores the currently determined value of aging compensation, $Y_t=Y_{n+1}$, necessary to correct the frequency deviation in the reference oscillator. The previously determined (and currently used) value of aging compensation, $Y_n$, remains stored in permanent memory ($Y_{perm}$). At 215, the system calculates the frequency error correction factor, absolute value of $Y_t - Y_{perm}$, and determines whether that value is greater than a certain maximum value, i.e., the maximum error permitted in the $Y_{perm}$ without modification. If yes, the system moves to 216 at which the new value $Y_t$ is set in permanent memory, $Y_t = Y_{perm}$.

Referring next to FIG. 8, there is shown a flow chart of the control program of the frequency stabilization compensation of the present system. At 301, the system waits for a pre-selected number of N seconds and then reads the temperature value of the thermistor contained within the reference oscillator at 302. Next, at 303, the system calculates the compensation voltage to be applied to the crystal from both the temperature component and the aging component (as well as the modulation voltage component discussed above), as set forth in the flow chart of FIG. 7, and determines the voltage compensation factor to be applied to the crystal. Next, at 304, the system determines whether or not the carrier of the transmitter of the mobile station is on. If the transmitter is on, no compensation can be made to avoid a jump in the frequency of the reference oscillator which might result from a change in compensation values, resulting in erroneous data being transmitted from the mobile. In such case, the system again returns to 301 to wait for X seconds and cycles it again. If, however, at 304 the carrier is not on, the system moves to 305 at which the output temperature voltage compensation, aging voltage compensation and modulation voltage compensation from the various D/A converters is applied to the reference oscillator to insure that the output signal therefrom is within the desired frequency stability range of the system.

As can be seen from the above description of the method and system of the present invention, an extremely high degree of frequency stability is obtained from relatively standard crystal oscillator circuits. This enables a high degree of accuracy within a narrow band, high data rate receiver/transmitter system with a relatively modest amount of cost.

While it is believed that the operation and construction of the system of the present invention will be apparent from the foregoing description, the method of operation shown and described and has been characterized as being preferred and obvious changes and modifications may be made therein without departing from the spirit and scope of the invention as defined in the following claims.

What is claimed is:

1. A system for generating a frequency compensation voltage for a crystal controlled reference oscillator within a mobile station of a packet data radio system, comprising:

first means for storing a sequence of voltage values each of which corresponds to the temperature compensation voltage to be applied to the reference oscillator at a particular temperature to produce a reference frequency signal at a particular frequency;

means for measuring the current temperature of the reference oscillator;

means for selecting the temperature compensation voltage corresponding to the measured temperature from said first storage means and applying said voltage to the reference oscillator;

means for receiving a burst of transmitted data from a base station;

means for comparing the frequency of the signal received from the base station with the frequency of the signal output from the reference oscillator and producing a difference signal;

second means for storing a crystal aging compensation value indicative of the difference between the frequency of the reference oscillator output signal and the frequency of the signal received from the base station;

means for determining whether the burst of transmitted data received was transmitted by the current base station of the mobile station; and means responsive to a determination that the base station from which the signal was received was the current base of the mobile for modifying said selected temperature compensation voltage in accordance with the aging compensation value in said second storage means and applying the modified voltage to the reference oscillator to produce the same frequency as that received from said base station.

2. A system for generating a frequency compensation voltage for a crystal controlled reference oscillator within a mobile station of a packet data radio system as set forth in claim 1 in which said frequency comparing means comprises:

means for counting a preselected number of cycles of a signal derived from the signal received from the base station and generating a periodic gating signal;

means for counting the number of cycles of a signal derived from the reference oscillator signal which occur between successive gating signals; and means for comparing the number of cycles counted with a value related to the frequency received from said base station to determine said difference indicative value.

3. A system for generating a frequency compensation voltage for a crystal controlled reference oscillator within a mobile station of a packet data radio system as set forth in claim 1 which also includes:

third means for storing a sequence of values representative of the variation of frequency of the crystal oscillator as a function of tuning voltage applied to the oscillator;

means for measuring the tuning voltage applied to the crystal oscillator;

means for selecting a value from said third storage means corresponding to the measured tuning voltage applied to the crystal oscillator;

means for further modifying the crystal temperature and crystal aging compensation voltages from said first and second storage means in accordance with the value selected from the third storage means and applying said further modified voltage to the crystal of said reference oscillator to obtain the frequency received from said base station.

4. A system for generating a frequency compensation voltage for a crystal controlled reference oscillator within a mobile station of a packet data radio system as set forth in claim 1 which also includes:
   means for determining when a complete data frame has been received within the burst of data transmitted from said base station;
   means for determining whether the received data contains more than a preselected number of data errors before operating said comparing means.

5. A system for generating a frequency compensation voltage for a crystal controlled reference oscillator within a mobile station of a packet data radio system as set forth in claim 4 in which said burst of data transmitted by said base station is formatted in accordance with a protocol which includes:
   a bit synchronization block having a fixed configuration of data;
   a frame head including a base station identity block; and
   a parity field which includes information for error correction.

6. A system for generating a frequency compensation voltage for a crystal controlled reference oscillator within a mobile station of a packet data radio system as set forth in claim 5 in which:
   said comparing means includes means for comparing the frequency of the signal received from base station during the portion of the burst containing the bit synchronization block.

7. A system for generating a frequency compensation voltage for a crystal controlled reference oscillator within a mobile station of a packet data radio system as set forth in claim 5 in which:
   said means for determining whether the burst of transmitted data receive was transmitted by the current base station of the mobile station includes means for recognizing the base station identity block within the frame head of the data burst.

8. A system for generating a frequency compensation voltage for a crystal controlled reference oscillator within a mobile station of a packet data radio system as set forth in claim 1 which also includes:
   means for comparing the crystal aging compensation value previously stored in said second storing means with the current crystal compensation value;
   means for determining the difference between said crystal aging compensation values; and
   means responsive to said difference exceeding a preselected value for storing a new crystal aging compensation value in said second storing means.

9. A system for generating a frequency compensation voltage for a crystal controlled reference oscillator within a mobile station of a packet data radio system as set forth in claim 8 in which:
   said means for storing a new crystal aging compensation value includes means for adding a fractional portion of the difference between the aging compensation values to the previously stored aging compensation value to obtain said new crystal aging compensation value to be stored.

10. A system for generating a frequency compensation voltage for a crystal controlled reference oscillator within a mobile station of a packet data radio system as set forth in claim 1 which also includes:
    means responsive to the difference between the frequency of the signal received from the base station with the frequency of the signal output from the reference oscillator exceeding a preselected value for inhibiting the operation of the transmitter of the mobile station.

11. A system for generating a frequency compensation voltage for a crystal controlled reference oscillator within a mobile station of a packet data radio system as set forth in claim 2 in which:
    said signal derived from the signal received from the base station is an intermediate frequency thereof.

12. A method for generating a frequency compensation voltage for a crystal controlled reference oscillator within a mobile station of a packet data radio system, comprising:
    storing a sequence of voltage values in a first location each of which corresponds to the temperature compensation voltage to be applied to the reference oscillator at a particular temperature to produce a reference frequency signal at a particular frequency;
    measuring the current temperature of the reference oscillator;
    selecting the temperature compensation voltage corresponding to the measured temperature from said first storage means and applying said voltage to the reference oscillator;
    receiving a burst of transmitted data from a base station;
    comparing the frequency of the signal received from the base station with the frequency of the signal output from the reference oscillator and producing a difference signal;
    storing in a second location a crystal aging compensation value indicative of the difference between the frequency of the reference oscillator output signal and the frequency of the signal received from the base station;
    determining whether the burst of transmitted data received was transmitted by the current base station of the mobile station; and
    modifying said selected temperature compensation voltage in accordance with the aging compensation value in said second storage location in response to a determination that the base station from which the signal was received was the current base of the mobile means and applying the modified voltage to the reference oscillator to produce the same frequency as that received from said base station.

13. A method for generating a frequency compensation voltage for a crystal controlled reference oscillator within a mobile station of a packet data radio system as set forth in claim 12 in which said frequency comparing step comprises:
    counting a preselected number of cycles of a signal derived from the signal received from the base station and generating a periodic gating signal;
    counting the number of cycles of a signal derived from the reference oscillator signal which occur between successive gating signals; and
    comparing the number of cycles counted with a value related to the frequency received from said base station to determine said and difference indicative value.

14. A method for generating a frequency compensation voltage for a crystal controlled reference oscillator within a mobile station of a packet data radio system as set forth in claim 12 which also includes:

storing a sequence of values in a third location which are representative of the variation of frequency of the crystal oscillator as a function of tuning voltage applied to the oscillator;

measuring the tuning voltage applied to the crystal oscillator;

selecting a value from said third storage location corresponding to the measured tuning voltage applied to the crystal oscillator;

further modifying the crystal temperature and crystal aging compensation voltages from said first and second storage locations in accordance with the value selected from the third storage location and applying said further modified voltage to said reference oscillator to obtain the frequency received from said base station.

15. A method for generating a frequency compensation voltage for a crystal controlled reference oscillator within a mobile station of a packet data radio system as set forth in claim 12 which also includes:

determining when a complete data frame has been received within the burst of data transmitted from said base station;

determining whether the received data contains more than a preselected number of data errors before said comparing step.

16. A method for generating a frequency compensation voltage for a crystal controlled reference oscillator within a mobile station of a packet data radio system as set forth in claim 15 in which said burst of data transmitted by said base station is formatted in accordance with a protocol which includes:

a bit synchronization block having a fixed configuration of data;

a frame head including a base station identity block; and a parity field which includes information for error correction.

17. A method for generating a frequency compensation voltage for a crystal controlled reference oscillator within a mobile station of a packet data radio system as set forth in claim 16 in which:

said comparing step includes comparing the frequency of the signal received from base station during the portion of the burst containing the bit synchronization block.

18. A method for generating a frequency compensation voltage for a crystal controlled reference oscillator within a mobile station of a packet data radio system as set forth in claim 16 in which:

said step of determining whether the burst of transmitted data receive was transmitted by the current base station of the mobile station includes recognizing the base station identity block within the frame head of the data burst.

19. A method for generating a frequency compensation voltage for a crystal controlled reference oscillator within a mobile station of a packet data radio system as set forth in claim 12 which also includes:

comparing the crystal aging compensation value previously stored in said second storage location with the current crystal compensation value;

determining the difference between said crystal aging compensation values; and storing a new crystal aging compensation value in said second storage location in response to said difference exceeding a preselected value.

20. A method for generating a frequency compensation voltage for a crystal controlled reference oscillator within a mobile station of a packet data radio system as set forth in claim 19 in which:

said step of storing a new crystal aging compensation value includes adding a fractional portion of the difference between the aging compensation values to the previously stored aging compensation value to obtain said new crystal aging compensation value to be stored.

21. A method for generating a frequency compensation voltage for a crystal controlled reference oscillator within a mobile station of a packet data radio system as set forth in claim 12 which also includes:

inhibiting the operation of the transmitter of the mobile station in response to the difference between the frequency of the signal received from the base station with the frequency of the signal output from the reference oscillator exceeding a preselected value.

22. A method for generating a frequency compensation voltage for a crystal controlled reference oscillator within a mobile station of a packet data radio system as set forth in claim 13 in which:

said signal derived from the signal received from the base station is an intermediate frequency thereof.

* * * * *

UNITED STATES PATENT AND TRADEMARK OFFICE
CERTIFICATE OF CORRECTION

PATENT NO. : 5,113,416
DATED : May 12, 1992
INVENTOR(S) : Lindell, Karl B.

It is certified that error appears in the above-indentified patent and that said Letters Patent is hereby corrected as shown below:

Column 16, line 65     Delete "and"

Signed and Sealed this

Sixteenth Day of July, 1996

Attest:

BRUCE LEHMAN

*Attesting Officer*     *Commissioner of Patents and Trademarks*